(12) United States Patent
Campitelli

(10) Patent No.: US 11,533,393 B2
(45) Date of Patent: Dec. 20, 2022

(54) CONTROL BUTTON DECAL ASSEMBLY

(71) Applicant: Kristie Campitelli, Las Vegas, NV (US)

(72) Inventor: Kristie Campitelli, Las Vegas, NV (US)

(*) Notice: Subject to any disclaimer, the term of this patent is extended or adjusted under 35 U.S.C. 154(b) by 44 days.

(21) Appl. No.: 17/143,490

(22) Filed: Jan. 7, 2021

(65) Prior Publication Data

US 2022/0217229 A1 Jul. 7, 2022

(51) Int. Cl.
*H04M 1/02* (2006.01)
*H05K 5/02* (2006.01)
*H05K 5/03* (2006.01)

(52) U.S. Cl.
CPC ........ *H04M 1/0283* (2013.01); *H05K 5/0243* (2013.01); *H05K 5/03* (2013.01)

(58) Field of Classification Search
CPC .... H04M 1/0279; H04M 1/0283; H05K 5/02; H05K 5/0204; H05K 5/0243; H05K 5/0252; H05K 5/03
See application file for complete search history.

(56) References Cited

U.S. PATENT DOCUMENTS

| | | | |
|---|---|---|---|
| 2,424,508 A * | 7/1947 | Simmonds | B44C 1/16 156/247 |
| 6,331,083 B1 | 12/2001 | Harris | |
| 7,040,824 B2 * | 5/2006 | Schaffner | G06F 3/0202 400/490 |
| 7,095,986 B2 | 8/2006 | Mager | |
| 2005/0144825 A1 | 7/2005 | Hopkins | |
| 2006/0056898 A1 | 3/2006 | Schaffner | |
| 2007/0161421 A1 | 7/2007 | Latto | |
| 2009/0060171 A1 | 3/2009 | Masuya | |
| 2016/0066636 A1 * | 3/2016 | West | A41D 27/08 150/154 |

* cited by examiner

*Primary Examiner* — Quochien B Vuong

(57) ABSTRACT

A control button decal assembly for enhancing visibility of control buttons on an electronic device includes a set of first decals, a set of second decals and a set of third decals that can each be chosen for positioning on a respective control button on an electronic device. Each of the first decals, the second decals and the third decals is brightly colored to enhance visibility of the respective control button. Each of the first decals, the second decals and the third decals has a color that is unique with respect to each other. In this way the set of first decals, the set of second decals and the set of third decals facilitate the user to have a variety of choices of colors which can be associated with the respective control button.

10 Claims, 6 Drawing Sheets

CONTROL BUTTON DECAL ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to decal devices and more particularly pertains to a new decal device for enhancing visibility of control buttons on an electronic device. The decal device includes a variety of decals that come in a variety of colors to facilitate the control buttons to be more readily visually identified.

(2) Description of Related Art Including Information Disclosed Under 37 CFR 1.97 and 1.98

The prior art relates to decal devices including a plurality of decals having letters of the alphabet being positioned thereon and which can be adhered to keys on a keyboard. The prior art also discloses a plurality of decals which each has unique symbols printed thereon that are each associated with standardized symbolism for mechanical devices. The prior art discloses a transparent faceplate that is positionable over an electronic device for customizing the appearance of the electronic device.

BRIEF SUMMARY OF THE INVENTION

An embodiment of the disclosure meets the needs presented above by generally comprising a set of first decals, a set of second decals and a set of third decals that can each be chosen for positioning on a respective control button on an electronic device. Each of the first decals, the second decals and the third decals is brightly colored to enhance visibility of the respective control button. Each of the first decals, the second decals and the third decals has a color that is unique with respect to each other. In this way the set of first decals, the set of second decals and the set of third decals facilitate the user to have a variety of choices of colors which can be associated with the respective control button.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
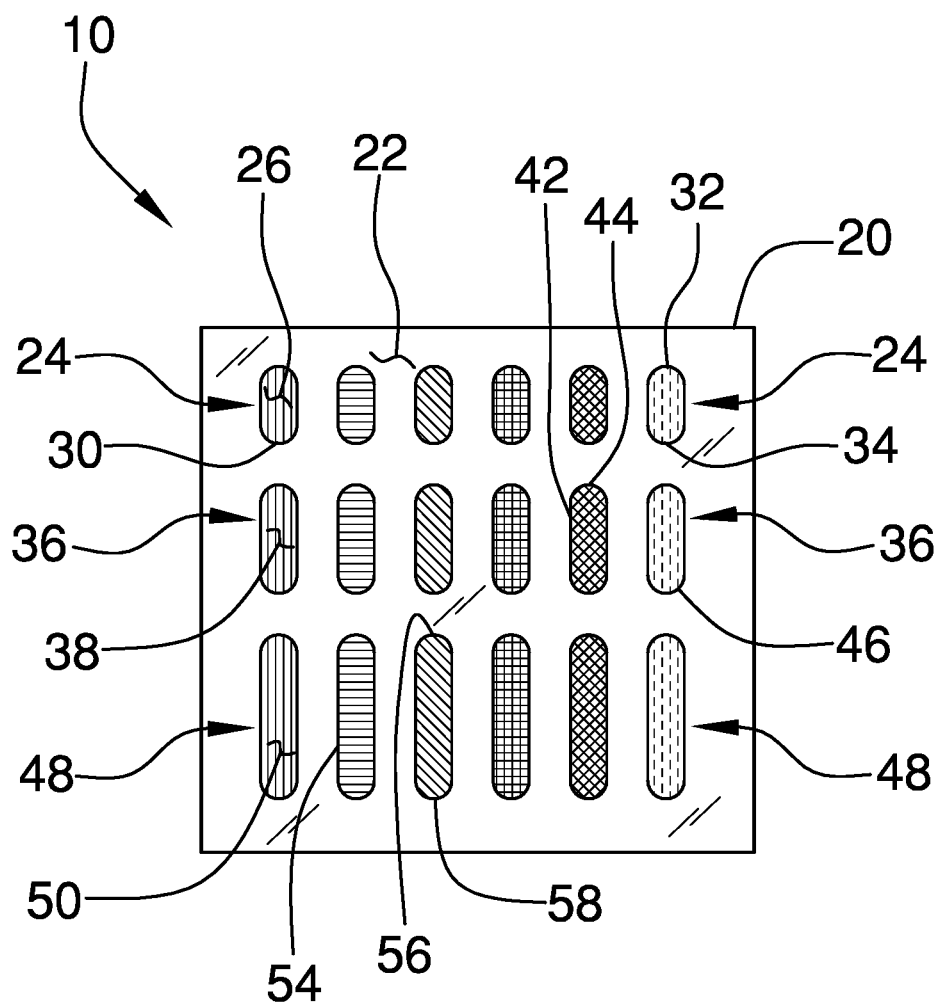
FIG. 1 is a top view of a control button decal assembly according to an embodiment of the disclosure.
Figure 2:
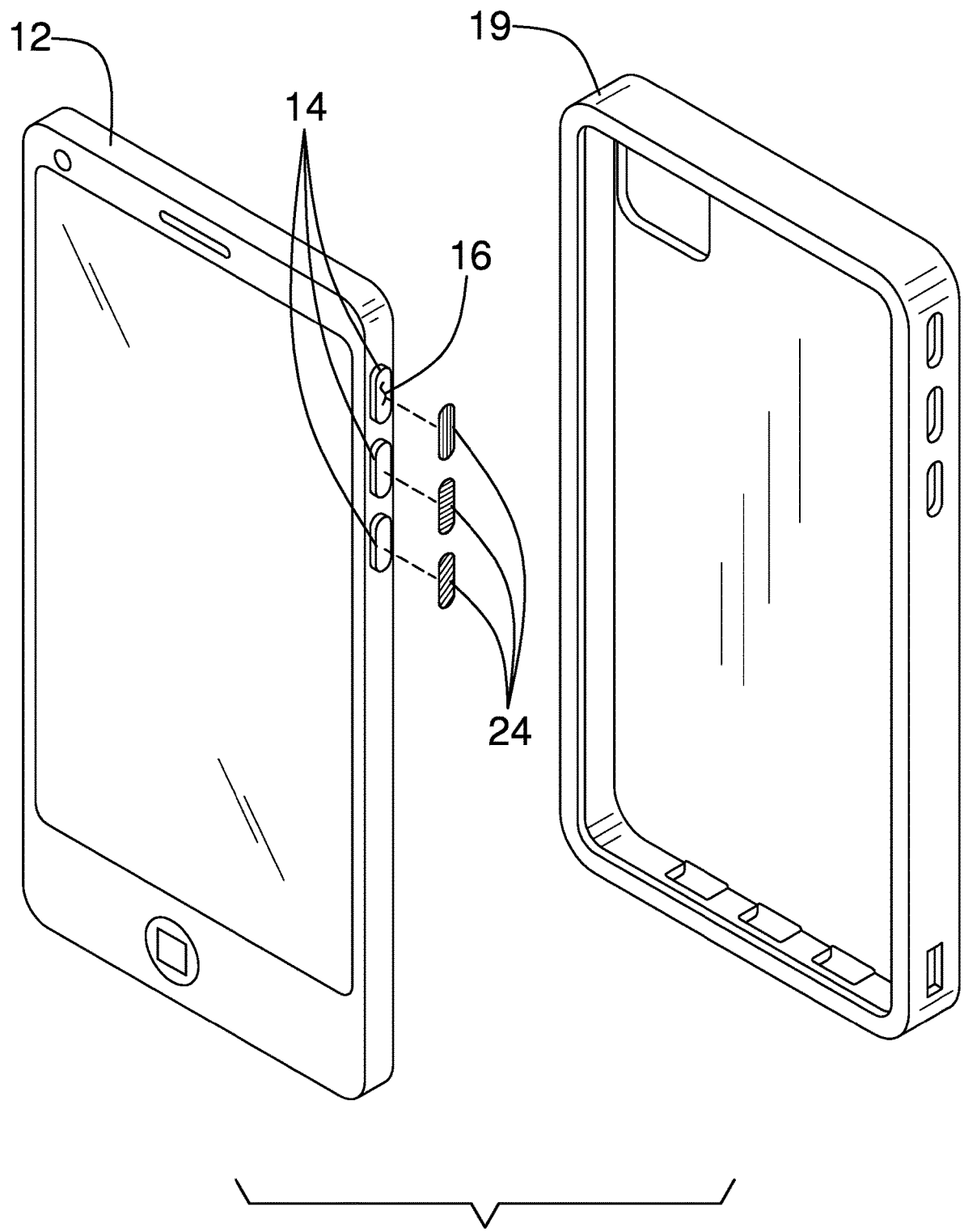
FIG. 2 is an exploded in-use view of an embodiment of the disclosure showing decals being positioned on control buttons of an electronic device.
Figure 3:
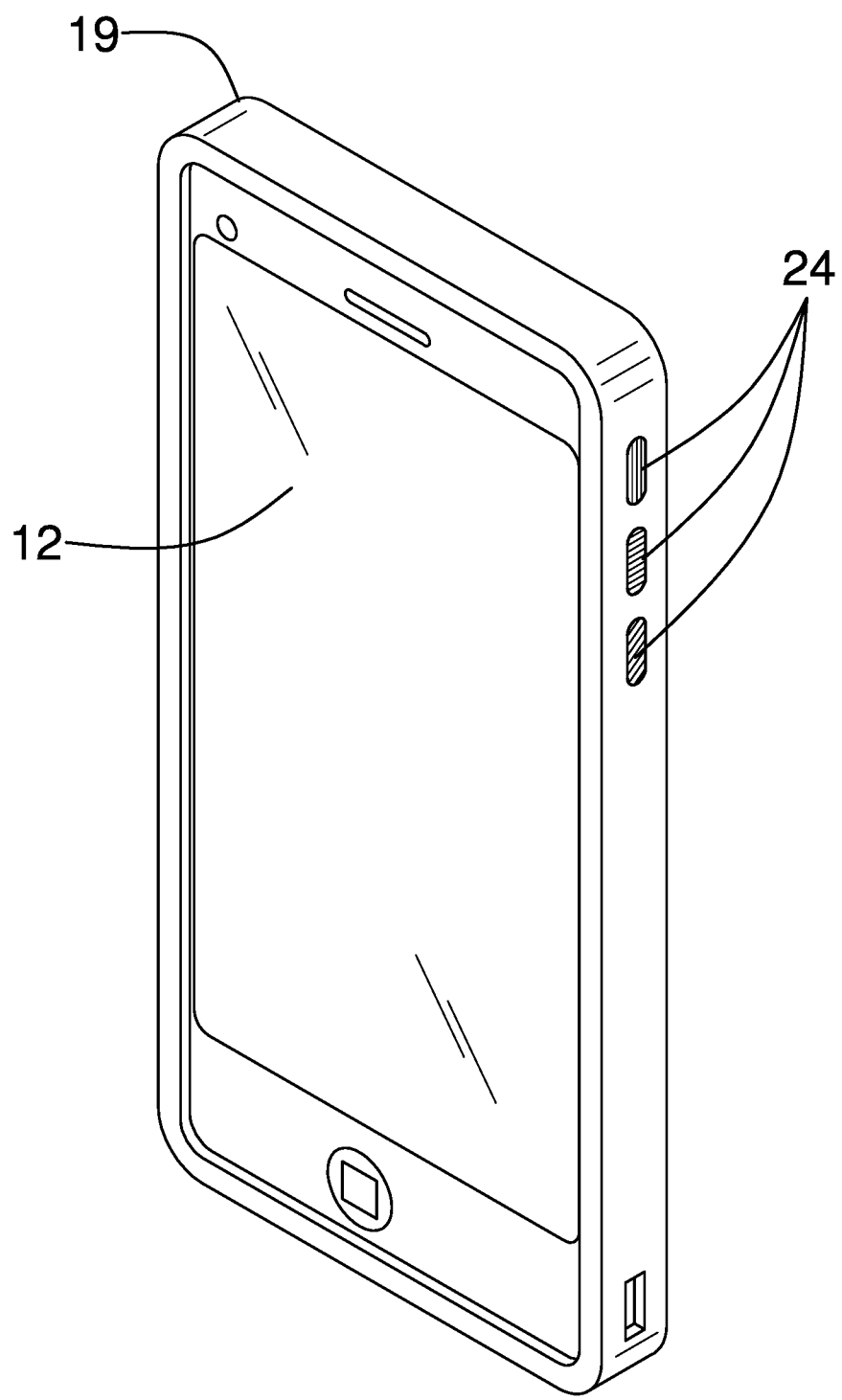
FIG. 3 is a perspective in-use view of an embodiment of the disclosure.
Figure 4:
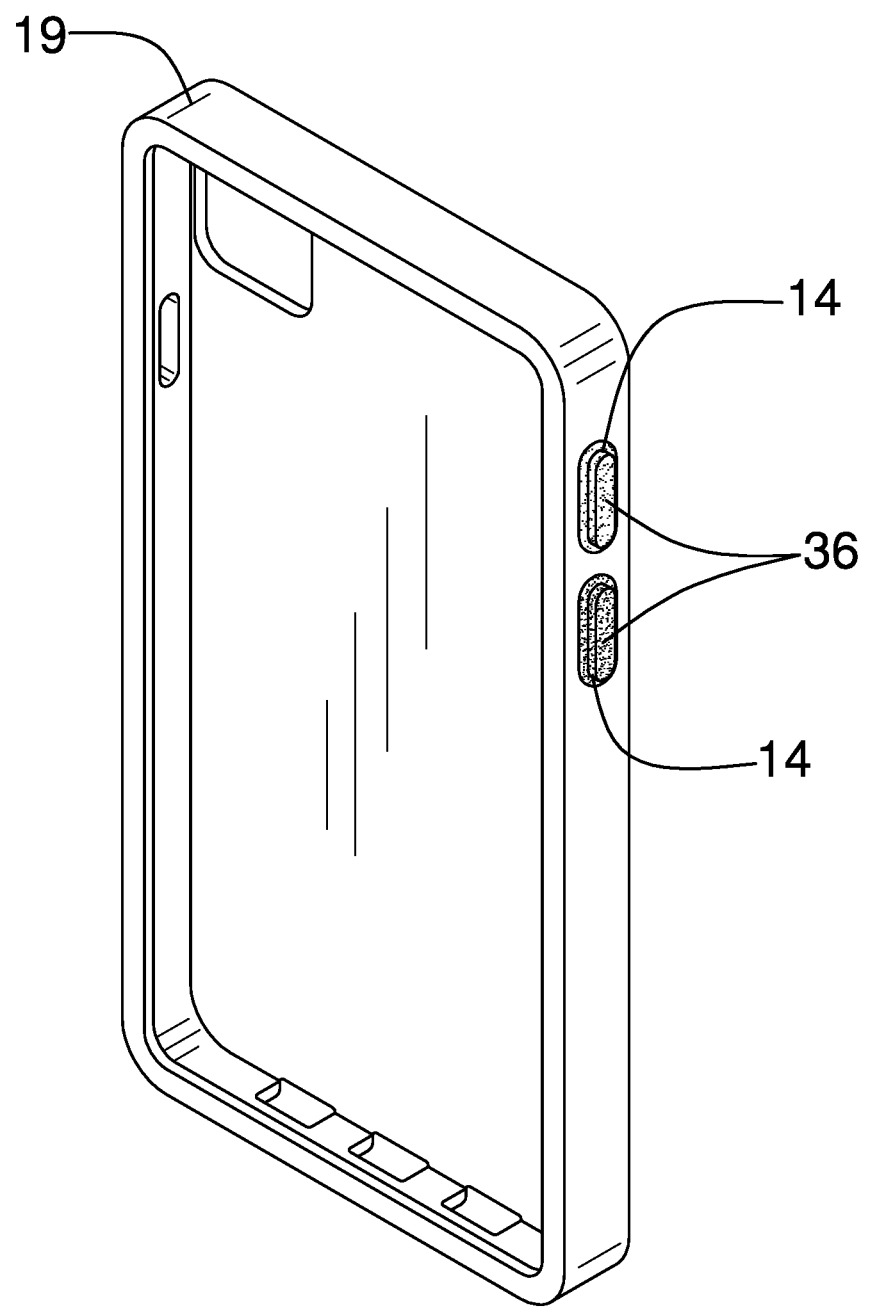
FIG. 4 is a perspective in-use view of an embodiment of the disclosure showing decals being positioned on control buttons of a case.
Figure 5:
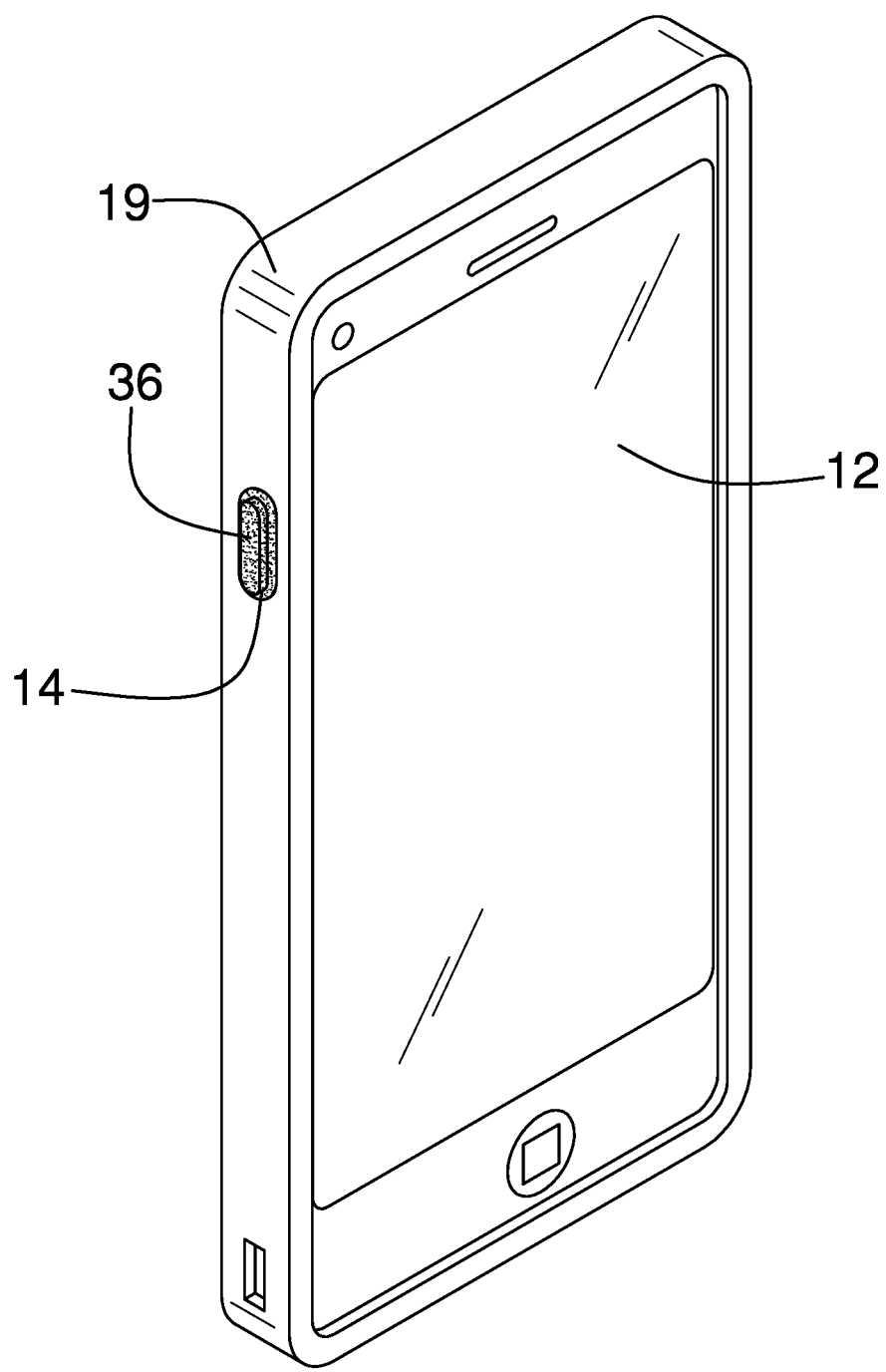
FIG. 5 is a front perspective in-use view of an embodiment of the disclosure.
Figure 6:
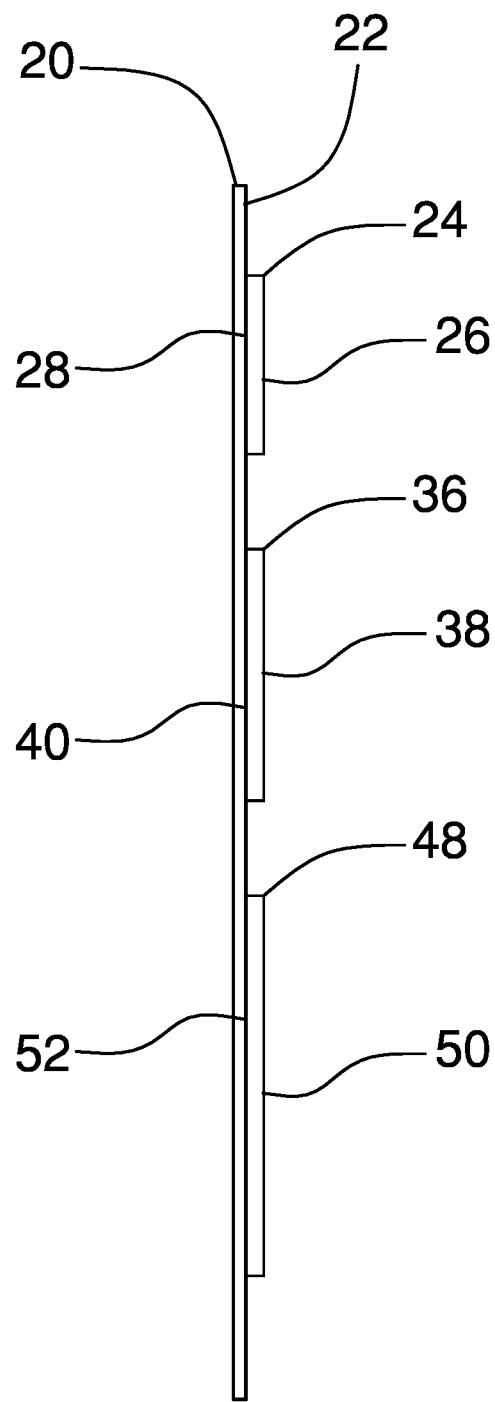
FIG. 6 is a right side view of an embodiment of the disclosure.

With reference now to the drawings, and in particular to FIGS. 1 through 6 thereof, a new decal device embodying the principles and concepts of an embodiment of the disclosure and generally designated by the reference numeral 10 will be described.

As best illustrated in FIGS. 1 through 6, the control button decal assembly 10 generally comprises an electronic device 12 has a plurality of control buttons 14. Each of the control buttons 14 has an exposed surface 16 that can be touched by a user 18. The electronic device 12 may be a smart phone or other personal electronic device. Additionally, each of the control buttons 14 may have an ovoid shape, and each of the control buttons 14 may have a unique length with respect to each other. The plurality of control buttons 14 may additionally be control buttons on a case in which the electronic device 12 is positioned, such as a smart phone case or the like. The control buttons 14 on the case may be strategically positioned to correspond with the location of each control button 14 on the electronic device 12.

A panel 20 is provided that has a first surface 22 which is comprised of a cohesive material. In this way the first surface 22 of the panel 20 resists being adhered to. A set of first decals 24 is provided and each of the first decals 24 is removably positioned on the first surface 22 of the panel 20. Additionally, each of the first decals 24 can be removed from the panel 20 by a user 18. Each of the first decals 24 is positionable on a respective one of the control buttons 14 on the electronic device 12. Moreover, each of the first decals 24 is brightly colored to enhance visibility of the respective control button 14. Additionally, each of the first decals 24 has a color that is unique with respect to each other. In this way the set of first decals 24 facilitates the user 18 to have a variety of choices of colors which can be associated with the respective control button 14.

Each of the first decals 24 has a primary surface 26, a secondary surface 28 and a perimeter edge 30. The primary surface 26 comprises an adhesive material thereby facilitating the primary surface 26 to adhere to the exposed surface 16 of the respective control button 14. The secondary surface 28 is brightly colored and the perimeter edge 30 is rounded around each of a first end 32 and a second end 34 of the first decals 24. Moreover, each of the first decals 24 is elongated a minimum distance between the first end 32 and the second end 34 such that each of the first decals 24 has an ovoid shape. In this way the first decals 24 can generally conform to the shape of control buttons 14 commonly found on smart phones and smart phone cases.

A set of second decals 36 is provided and each of the second decals 36 is removably positioned on the first surface 22 of the panel 20. Each of the second decals 36 can be removed from the panel 20 by a user 18 for positioning on a respective one of the control buttons 14. Additionally, each of the second decals 36 is brightly colored to enhance visibility of the respective control button 14. Each of the second decals 36 has a color that is unique with respect to each other. In this way the set of second decals 36 facilitates the user 18 to have a variety of choices of colors which can be associated with the respective control button 14. Moreover, each of the second decals 36 has a color that is the same as the color of a respective one of the first decals 24. In this way the user 18 can match colors of selected control buttons 14 on the smart phone or the smart phone case.

Each of the second decals 36 has a primary surface 38, a secondary surface 40 and a perimeter edge 42, and the primary surface 38 of each of second decals 36 comprises an adhesive material. In this way the primary surface 38 of each of the second decals 36 can adhere to the exposed surface 16 of the respective control button 14. The secondary surface 40 of each of the second decals 36 is brightly colored to enhance visibility of the respective control button 14. The perimeter edge 42 of each of the second decals 36 is rounded around each of a first end 44 and a second end 46 of the second decals 36. Moreover, each of the second decals 36 is elongated a medium distance between the first end 44 and the second end 46 of the second decals 36 such that each of the second decals 36 has an ovoid shape which has a length that is greater than the length of the ovoid shape of each of the first decals 24. In this way the second decals 36 can generally conform to control buttons 14 that are longer than the first decals 24.

A set of third decals 48 is provided and each of the third decals 48 is removably positioned on the first surface 22 of the panel 20. Each of the third decals 48 can be removed from the panel 20 by a user 18 for positioning on a respective one of the control buttons 14. Each of the third decals 48 is brightly colored to enhance visibility of the respective control button 14. Additionally, each of the third decals 48 has a color that is unique with respect to each other. In this way the set of third decals 48 facilitates the user 18 to have a variety of choices of colors which can be associated with the respective control button 14. Each of the third decals 48 has a color that is the same as the color of a respective one of the first decals 24 and a respective one of the second decals 36. In this way the user 18 can match colors of selected control buttons 14 on the smart phone or the smart phone case.

Each of the third decals 48 has a primary surface 50, a secondary surface 52 and a perimeter edge 54, and the primary surface 50 of each of third decals 48 comprises an adhesive material. In this way the primary surface 50 of each of the third decals 48 can adhere to the exposed surface 16 of the respective control button 14. The secondary surface 28 of each of the third decals 48 is brightly colored to enhance the visibility of the respective control button 14. The perimeter edge 30 of each of the third decals 48 is rounded around each of a first end 56 and a second end 58 of the third decals 48. Moreover, each of the third decals 48 is elongated a maximum distance between the first end 56 and the second end 58 of the third decals 48 such that each of the third decals 48 has an ovoid shape that has a length which is greater than the ovoid shape of the second decals 36. In this way the third decals 48 can generally conform to control buttons 14 that are longer than the second decals 36.

In use, respective first decals 24, second decals 36 or third decals 48 are chosen based on the length of the respective control button 14, and the respective first decal 24, second decal 36 or third decal 48 is adhered to the respective control button 14. The colors associated with each of the control buttons 14 can be chosen based on the function of each control button, the location of the control buttons 14 or for any other reason that the user 18 chooses. In this way the first decals 24, the second decals 36 and the third decals 48 facilitate the user 18 to customize the appearance of the electronic device 12 in a variety of manners. Moreover, the bright colors of the first decals 24, second decals 36 and third decals 48 facilitate the user 18 to identify, from a distance, the meaning assigned to each control button by the user 18's choice of color. Thus, the user 18 can quickly and efficiently employ the control buttons 14 on the smart phone or the smart phone case.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A control button decal assembly for placing brightly colored decals on control buttons to facilitate visually identifying functions of the control buttons from a distance, said assembly comprising:

a panel having a first surface being comprised of a cohesive material wherein said first surface is configured to resist being adhered to;

a set of first decals, each of said first decals being removably positioned on said first surface of said panel wherein each of said first decals is configured to be removed from said panel by a user for positioning on a respective control button on an electronic device, each of said first decals being brightly colored wherein each of said first decals is configured to enhance visibility of the respective control button, each of said first decals having a color being unique with respect to each other wherein said set of first decals is configured to facilitate the user to have a variety of choices of colors which can be associated with the respective control button;

a set of second decals, each of said second decals being removably positioned on said first surface of said panel wherein each of said second decals is configured to be removed from said panel by a user for positioning on a respective control button on an electronic device, each of said second decals being brightly colored wherein each of said second decals is configured to enhance visibility of the respective control button, each of said second decals having a color being unique with respect to each other wherein said set of second decals is configured to facilitate the user to have a variety of choices of colors which can be associated with the respective control button, each of said second decals having a color being the same as the color of a respective one of said first decals;

a set of third decals, each of said third decals being removably positioned on said first surface of said panel wherein each of said third decals is configured to be removed from said panel by a user for positioning on a respective control button on an electronic device, each of said third decals being brightly colored wherein each of said third decals is configured to enhance visibility of the respective control button, each of said third decals having a color being unique with respect to each other wherein said set of third decals is configured to facilitate the user to have a variety of choices of colors which can be associated with the respective control button, each of said third decals having a color being the same as the color of a respective one of said first decals and a respective one of said second decals.

2. The assembly according to claim 1, wherein each of said first decals having a primary surface, a secondary surface and a perimeter edge, said primary surface comprising an adhesive material wherein said primary surface is configured to adhere to the respective control button, said secondary surface being brightly colored.

3. The assembly according to claim 2, wherein said perimeter edge is rounded around each of a first end and a second end of said first decals, each of said first decals being elongated a minimum distance between said first end and said second end such that each of said first decals has an ovoid shape.

4. The assembly according to claim 2, wherein each of said third decals has a primary surface, a secondary surface and a perimeter edge, said primary surface of each of third decals comprising an adhesive material wherein said primary surface of each of said third decals is configured to adhere to the respective control button, said secondary surface of each of said third decals being brightly colored.

5. The assembly according to claim 4, wherein said perimeter edge of each of said third decals is rounded around each of a first end and a second end of said third decals, each of said third decals being elongated a maximum distance between said first end and said second end of said third decals such that each of said third decals has an ovoid shape having a length being greater than the length of an ovoid shape of each of said second decals.

6. The assembly according to claim 1, wherein each of said second decals has a primary surface, a secondary surface and a perimeter edge, said primary surface of each of second decals comprising an adhesive material wherein said primary surface of each of said second decals is configured to adhere to the respective control button, said secondary surface of each of said second decals being brightly colored.

7. The assembly according to claim 6, wherein said perimeter edge of each of said second decals is rounded around each of a first end and a second end of said second decals, each of said second decals being elongated a medium distance between said first end and said second end of said second decals such that each of said second decals has an ovoid shape having a length being greater than the length of an ovoid shape of each of said first decals.

8. The assembly according to claim 1, wherein:

each of said first decals has a primary surface, a secondary surface and a perimeter edge, said primary surface comprising an adhesive material wherein said primary surface is configured to adhere to the respective control button, said secondary surface being brightly colored, said perimeter edge is rounded around each of a first end and a second end of said first decals, each of said first decals being elongated a minimum distance between said first end and said second end such that each of said first decals has an ovoid shape;

said perimeter edge of each of said second decals is rounded around each of a first end and a second end of said second decals, each of said second decals being elongated a medium distance between said first end and said second end of said second decals such that each of said second decals has an ovoid shape having a length being greater than the length of an ovoid shape of each of said first decals; and each of said third decals has a primary surface, a secondary surface and a perimeter edge, said primary surface of each of third decals comprising an adhesive material wherein said primary surface of each of said third decals is configured to adhere to the respective control button, said secondary surface of each of said third decals being brightly colored, said perimeter edge of each of said third decals is rounded around each of a first end and a second end of said third decals, each of said third decals being elongated a maximum distance between said first end and said second end of said third decals such that each of said third decals has an ovoid shape having a length being greater than the length of an ovoid shape of each of said second decals.

9. A control button decal system for placing brightly colored decals on control buttons to facilitate visually identifying functions of the control buttons from a distance, said system comprising:

an electronic device having a plurality of control buttons, each of said control buttons having an exposed surface wherein said exposed surface is configured to be touched by a user;

a panel having a first surface being comprised of a cohesive material wherein said first surface is configured to resist being adhered to;

a set of first decals, each of said first decals being removably positioned on said first surface of said panel wherein each of said first decals is configured to be removed from said panel by a user, each of said first decals being positionable on a respective one of said control buttons on said electronic device, each of said first decals being brightly colored wherein each of said first decals is configured to enhance visibility of said respective control button, each of said first decals having a color being unique with respect to each other wherein said set of first decals is configured to facilitate the user to have a variety of choices of colors which can be associated with said respective control button, each of said first decals having a primary surface, a secondary surface and a perimeter edge, said primary surface comprising an adhesive material thereby facilitating said primary surface to adhere to said exposed surface of said respective control button, said secondary surface being brightly colored, said perimeter edge being rounded around each of a first end and a second end of said first decals, each of said first decals being elongated a minimum distance between said first end and said second end such that each of said first decals has an ovoid shape;

a set of second decals, each of said second decals being removably positioned on said first surface of said panel wherein each of said second decals is configured to be removed from said panel by a user for positioning on a respective one of said control buttons, each of said second decals being brightly colored wherein each of said second decals is configured to enhance visibility of said respective control button, each of said second decals having a color being unique with respect to each other wherein said set of second decals is configured to facilitate the user to have a variety of choices of colors which can be associated with said respective control button, each of said second decals having a color being the same as the color of a respective one of said first decals, each of said second decals having a primary surface, a secondary surface and a perimeter edge, said primary surface of each of second decals comprising an adhesive material thereby facilitating said primary surface of each of said second decals to adhere to said exposed surface of said respective control button, said secondary surface of each of said second decals being brightly colored, said perimeter edge of each of said second decals being rounded around each of a first end and a second end of said second decals, each of said second decals being elongated a medium distance between said first end and said second end of said second decals such that each of said second decals has an ovoid shape having a length being greater than the length of said ovoid shape of each of said first decals; and a set of third decals, each of said third decals being removably positioned on said first surface of said panel wherein each of said third decals is configured to be removed from said panel by a user for positioning on a respective one of said control buttons, each of said third decals being brightly colored wherein each of said third decals is configured to enhance visibility of the respective control button, each of said third decals having a color being unique with respect to each other wherein said set of third decals is configured to facilitate the user to have a variety of choices of colors which can be associated with said respective control button, each of said third decals having a color being the same as the color of a respective one of said first decals and a respective one of said second decals, each of said third decals having a primary surface, a secondary surface and a perimeter edge, said primary surface of each of third decals comprising an adhesive material thereby facilitating said primary surface of each of said third decals to adhere to said exposed surface of said respective control button, said secondary surface of each of said third decals being brightly colored, said perimeter edge of each of said third decals being rounded around each of a first end and a second end of said third decals, each of said third decals being elongated a maximum distance between said first end and said second end of said third decals such that each of said third decals has an ovoid shape having a length being greater than the ovoid shape of said second decals.

10. A method of enhancing visibility of control buttons on an electronic device, the method comprising:
providing a plurality of first decals, each of said first decals having a unique color with respect to each other, each of said first decals being elongated to a minimum length;
providing a plurality of second decals, each of said second decals having a unique color with respect to each other, each of said second decals having a color corresponding to a respective one of said first decals, each of said second decals being elongated to a medium length;
providing a plurality of third decals, each of said third decals having a unique color with respect to each other, each of said third decals having a color corresponding to a respective one of said first decals and a respective one of said second decals, each of said third decals being elongated to a medium length;
providing an electronic device having a plurality of control buttons thereon;
selecting a respective first decal, second decal or third decal based upon preference of length and color; and
adhering said respective first decal, second decal or third decal to a respective one of said control buttons such that said respective first decal, second decal or third decal enhances visibility of said respective control button, said respective first decal, second decal or third decal facilitating the function of said respective control button to be identified from a distance.

* * * * *